(12) United States Patent
Sadaka (10) Patent No.: US 8,970,045 B2
(45) Date of Patent: Mar. 3, 2015

(54) METHODS FOR FABRICATION OF SEMICONDUCTOR STRUCTURES INCLUDING INTERPOSERS WITH CONDUCTIVE VIAS, AND RELATED STRUCTURES AND DEVICES

(75) Inventor: Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/397,954

(22) Filed: Feb. 16, 2012

(65) Prior Publication Data

US 2013/0214423 A1    Aug. 22, 2013

(51) Int. Cl.
*H01L 23/522* (2006.01)

(52) U.S. Cl.
USPC ........... 257/774; 438/667; 438/455; 438/458; 438/106; 438/109

(58) Field of Classification Search
USPC .................. 257/774, E21.567, 686, E23.145
See application file for complete search history.

(56) References Cited

U.S. PATENT DOCUMENTS

| | | | |
|---|---|---|---|
| 6,303,468 B1 | 10/2001 | Aspar | |
| 6,335,258 B1 | 1/2002 | Aspar et al. | |
| 6,453,553 B1 | 9/2002 | Caillat et al. | |
| 6,756,286 B1 | 6/2004 | Moriceau et al. | |
| 6,809,044 B1 | 10/2004 | Aspar et al. | |
| 6,946,365 B2 | 9/2005 | Aspar | |
| RE39,484 E | 2/2007 | Bruel | |
| 2004/0056344 A1* | 3/2004 | Ogawa et al. | 257/686 |
| 2004/0222500 A1 | 11/2004 | Aspar et al. | |
| 2006/0105496 A1* | 5/2006 | Chen et al. | 438/106 |
| 2006/0177173 A1* | 8/2006 | Shastri et al. | 385/14 |
| 2007/0122926 A1 | 5/2007 | Martinez et al. | |
| 2009/0111214 A1 | 4/2009 | Christensen et al. | |
| 2009/0256258 A1 | 10/2009 | Kreupl et al. | |
| 2012/0052654 A1 | 3/2012 | Yang et al. | |

FOREIGN PATENT DOCUMENTS

| | | |
|---|---|---|
| WO | 2010015878 A2 | 2/2010 |
| WO | 2012011230 A1 | 1/2012 |

OTHER PUBLICATIONS

French Search Report and Written Opinion for French Application No. 1251871 dated Aug. 17, 2012, 7 pages.

(Continued)

*Primary Examiner* — Chuong A Luu
*Assistant Examiner* — Rodolfo Fortich
(74) *Attorney, Agent, or Firm* — TraskBritt (57) ABSTRACT

Methods of fabricating semiconductor devices that include interposers include the formation of conductive vias through a material layer on a recoverable substrate. A carrier substrate is bonded over the material layer, and the recoverable substrate is then separated from the material layer to recover the recoverable substrate. A detachable interface may be provided between the material layer and the recoverable substrate to facilitate the separation. Electrical contacts that communicate electrically with the conductive vias may be formed over the material layer on a side thereof opposite the carrier substrate. Semiconductor structures and devices are formed using such methods.

27 Claims, 5 Drawing Sheets

(56) References Cited

OTHER PUBLICATIONS

Decker, David M., U.S. Appl. No. 13/077,365, filed Mar. 31, 2011 and entitled "Methods of Forming Bonded Semiconductor Structures Including Two or More Processed Semiconductor Structures Carried by a Common Substrate, and Semiconductor Structures Formed by Such Methods."

Sunohara et al., Silicon Interposer with TSVs (Through Silicon Vias) and Fine Multilayer Wiring, Proc 58th Electronic Components and Technology Conference, Lake Beuna Vista, FL, May 2008, pp. 847-852.

* cited by examiner

METHODS FOR FABRICATION OF SEMICONDUCTOR STRUCTURES INCLUDING INTERPOSERS WITH CONDUCTIVE VIAS, AND RELATED STRUCTURES AND DEVICES

CROSS-REFERENCE TO RELATED APPLICATION

The subject matter of this application is related to the subject matter of U.S. patent application Ser. No. 13/077,364, filed Mar. 31, 2011, now U.S. Pat. No. 8,338,294, issued Dec. 25, 2012 and entitled "Methods of Forming Bonded Semiconductor Structures Including Two or More Processed Semiconductor Structures Carried by a Common Substrate, and Semiconductor Structures Formed by Such Methods."

TECHNICAL FIELD

The present disclosure relates to methods of forming and using interposers in the fabrication of semiconductor devices, and to structures and devices fabricated using such methods.

BACKGROUND

In the fabrication of semiconductor devices that include an integrated circuit, such as electronic signal processors, memory devices, and photoactive devices (e.g., light-emitting devices (LEDs), laser diodes, photocells, photodetectors, etc.), it is often desirable to employ what is referred to in the art as an "interposer" between two devices (e.g., between two integrated circuit devices), between a device and a structure (e.g., between an integrated circuit device and a package substrate, such as a circuit board or layer), or between two structures. The interposer is disposed between the two devices and/or structures, and may be used to provide a structural and electrical interconnection between the two devices and/or structures.

In some cases, the interposer may be used to redistribute an electrical connection pattern. For example, an integrated circuit device may have an array of electrical contact features arranged in a first pattern, and another device or structure to which the integrated circuit device is to be coupled may have an array of electrical contact features arranged in a different, second pattern. Thus, the integrated circuit device cannot simply be abutted against and bonded to the another device or structure to establish electrical connection between the electrical contact features of the integrated circuit device and the electrical contact features of the another device or structure.

To facilitate the electrical interconnection, an interposer may be fabricated that includes a first set of electrical contact features on a first side thereof arranged in a pattern that is a mirror image of the pattern of the electrical contact features of the integrated circuit device, and a second set of electrical contact features on an opposing second side thereof arranged in a different pattern that is a mirror image of the pattern of the electrical contact features of the another device or structure. The interposer may comprise one or more of electrically conductive vias that extend vertically through at least a portion of the interposer perpendicular to the major plane of the interposer, electrically conductive traces that extend horizontally across the interposer parallel to the major plane of the interposer, and electrically conductive contact pads, which define the locations at which electrical contact is to be established with the integrated circuit device and the another device or structure. The conductive vias and traces may be used to "redistribute" the pattern of the contact pads on the first side of the interposer to a different pattern of the contact pads on the opposing second side of the interposer. In this configuration, the contact pads on the first side of the interposer may be structurally and electrically coupled to the electrical contact features of the integrated circuit device, and the contact pads on the opposing second side of the interposer may be structurally and electrically coupled to the electrical contact features of the another structure or device, thereby providing an electrical interconnection between the integrated circuit device and the another structure or device through the interposer.

Interposers are commonly relatively thick so as to enable handling and manipulation of the interposers by common semiconductor fabrication processing equipment. For example, interposers may have an average layer thickness of two hundred microns (200 µm) or more.

The features of semiconductor devices continue to scale downward to smaller dimensions. As the average cross-sectional dimension (e.g., the average diameter) of conductive vias formed through interposers are decreased, the aspect ratios of the conductive vias increases. The aspect ratio of a conductive via is defined as the length of the conductive via (in the vertical dimension perpendicular to the major plane of the interposer) divided by the average cross-sectional dimension of the conductive via. For example, a conductive via having a length of two hundred microns (200 µm) and an average cross-sectional dimension of forty microns (40 µm) has an aspect ratio of five (5) (i.e., 200/40=5).

Conductive vias having high aspect ratios are difficult to form. To form conductive vias in interposers, holes may be first formed through the interposer and subsequently filled with conductive metal using one or more plating processes (e.g., a first electroless plating process followed by an electrolytic plating process). Holes having high aspect ratios are difficult to fill with the metal in the plating process due to the need to deposit metal with good step coverage and free of voids. For example, the regions in the holes proximate the opposing major surfaces of the interposer may become plugged with metal prior to completely filling the region of the hole near the center of the interposer, thereby preventing further deposition of metal within the hole and resulting in voids within the resulting conductive via. Such voids can render the conductive vias inoperable. Also, larger conductive vias require the use of more metal, which adds to cost and increases the duration of the metal deposition process. Larger conductive vias also occupy more area on the interposer, which limits the number of conductive vias that may be formed in a given area of the interposer, which may limit the overall operational bandwidth of any semiconductor device such as an interposer.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of fabricating semiconductor devices that include interposers. In accordance with such methods, conductive vias are formed through a material layer on a recoverable substrate. A carrier substrate is bonded over the material layer on a side thereof opposite the recoverable substrate, and the recoverable substrate is separated from the material layer to recover the recoverable substrate. Electrical contacts are formed over the material layer on a side thereof opposite the carrier substrate, and the electrical contacts communicate electrically with the conductive vias.

In additional methods of fabricating semiconductor devices that include interposers, a detachable interface is formed between a semiconductor layer and a recoverable substrate. The detachable interface comprising a controlled level of mechanical strength between the semiconductor layer and the recoverable substrate. Conductive vias are then formed through the semiconductor layer on the recoverable substrate. A carrier substrate is bonded over the semiconductor layer on a side thereof opposite the recoverable substrate, and the recoverable substrate is separated from the semiconductor layer to recover the recoverable substrate. Electrical contacts that communicate electrically with the conductive vias then may be formed over the semiconductor layer on a side thereof opposite the carrier substrate.

Yet further embodiments of the present disclosure include intermediate and fully fabricated semiconductor structures and devices formed using methods as described herein.

For example, in some embodiments, intermediate structures formed during fabrication of semiconductor devices include a semiconductor layer bonded over a recoverable substrate with a detachable interface of controlled mechanical strength between the semiconductor layer and the recoverable substrate, and conductive vias extending through the semiconductor layer. A carrier substrate may be bonded over the semiconductor layer on a side thereof opposite the recoverable substrate.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

The illustrations presented herein are not meant to be actual views of any particular semiconductor material, structure, device, or method, but are merely idealized representations that are used to describe embodiments of the disclosure. Any headings used herein should not be considered to limit the scope of embodiments of the invention as defined by the claims below and their legal equivalents. Concepts described in any specific heading are generally applicable in other sections throughout the entire specification. A number of references are cited herein, the entire disclosures of which are incorporated herein in their entirety by this reference for all purposes. Further, none of the cited references, regardless of how characterized herein, is admitted as prior art relative to the invention of the subject matter claimed herein.

Methods of fabricating semiconductor devices that include an interposer as described herein may provide a relatively thin interposer that includes conductive vias having relatively low aspect ratios. As discussed in further detail below, the methods generally include forming conductive vias through a material layer on a substrate, which may be a recoverable substrate. A carrier substrate is bonded over the material layer on a side thereof opposite the recoverable substrate, after which the recoverable substrate may be separated from the material layer to recover the recoverable substrate. Electrical contacts communicating electrically with the conductive vias then may be formed over the material layer on a side thereof opposite the carrier substrate.

Figure 1:
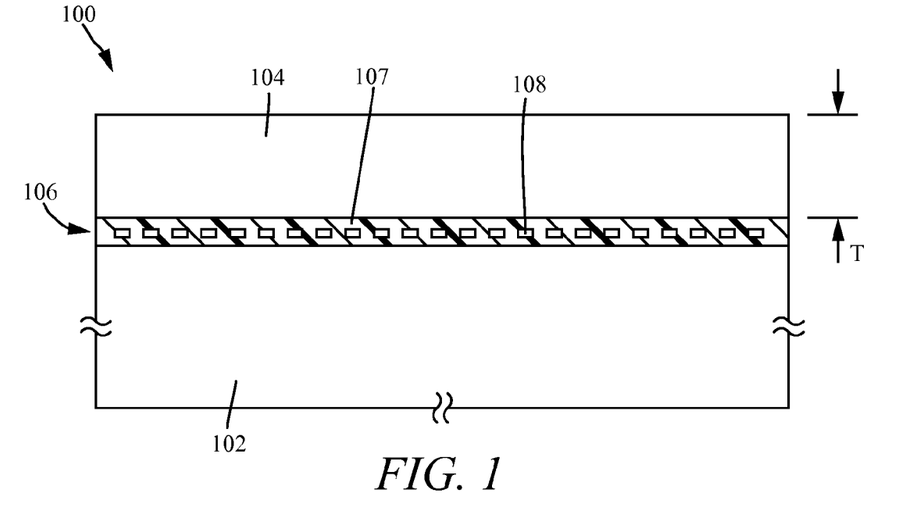
FIG. 1 is a simplified cross-sectional view of a material layer that is used to form an interposer on a recoverable substrate with a detachable interface between the material layer and the recoverable substrate.

A structure 100 is shown in FIG. 1 that includes a recoverable substrate 102. A material layer 104 is disposed on the recoverable substrate 102. In some embodiments, a detachable interface 106 may be formed or otherwise provided between the material layer 104 and the recoverable substrate 102. The detachable interface 106 may provide a bond of controlled mechanical strength between the material layer 104 and the recoverable substrate 102, and may be used to detach the recoverable substrate 102 from the material layer 104 after further processing as discussed below.

The material layer 104 may comprise a layer of semiconductor material in some embodiments. In other words, the material layer 104 may comprise a semiconductor layer. As non-limiting examples, the material layer 104 may comprise at least one of silicon, germanium, silicon carbide, diamond, and a III-V semiconductor material. In some embodiments, the material layer 104 may consist essentially of silicon, and the silicon may be polycrystalline or monocrystalline.

The recoverable substrate 102 may comprise a semiconductor material (e.g., silicon (prime or mechanical grade for low cost of ownership), germanium, a III-V semiconductor material, etc.) or a ceramic material, such as an oxide (e.g., aluminum oxide, silicon oxide zirconium oxide, etc.), a nitride (e.g., silicon nitride), or a carbide (e.g., silicon carbide).

The detachable interface 106 between the recoverable substrate 102 and the material layer 104 may be formed as disclosed in, for example, any one of U.S. Patent Application Publication No. 2004/0222500, published Nov. 11, 2004 in the name of Aspar et al., U.S. Patent Application Publication No. 2007/0122926, published May 31, 2007 in the name of Martinez et al., and International Publication No. WO 2010/015878 A2, published Feb. 11, 2010 in the name of Faure et al., the disclosure of each of which is hereby incorporated herein in its entirety by this reference.

In some embodiments, the detachable interface 106 may comprise a direct molecular bond between the material layer 104 and the recoverable substrate 102. In other embodiments, as shown in FIG. 1, the detachable interface 106 may include an intermediate material 107 disposed between the material layer 104 and the recoverable substrate 102. Such an intermediate material 107 may comprise one or more of a semiconductor material, dielectric material, or a ceramic material, such as any of those mentioned above. In other embodiments, the intermediate material 107 may comprise a metal. In yet further embodiments, the intermediate material 107 may comprise a multi-layer structure including two or more such materials.

As a non-limiting example, as described in U.S. Patent Application Publication No. 2004/0222500, the mechanical strength of the detachable interface 106 may be controlled by controlling at least one of the roughness and the hydrophilicity of opposing faces of the material layer 104 and the recoverable substrate 102 prior to bonding the material layer 104 over the recoverable substrate 102. For example, if one or both of the opposing faces comprises $SiO_2$, for example, the $SiO_2$ surface may be etched using hydrofluoric acid to control the surface roughness thereof. Other chemical treatments may be used depending on the nature of the material to be etched. For example, phosphoric acid ($H_3PO_4$) may be used to etch and roughen silicon nitride ($Si_3N_4$), and a solution of ammonium hydroxide ($NH_4OH$), hydrogen peroxide ($H_2O_2$), and water ($H_2O$) may be used to etch and roughen silicon. In additional techniques, selectively controlled heat treatments may be used to control the mechanical strength of a molecular bond between the material layer 104 and the recoverable substrate 102.

Thus, in some embodiments, voids 108 may be present at the detachable interface 106. The voids 108 may be due to initial surface roughness between adjacent bonded surfaces, and may be randomly located across the detachable interface 106. In other embodiments, the voids 108 may be formed in one or both of the adjacent bonded surfaces prior to bonding, and may be located at predefined and selected locations across the detachable interface 106. The number and size of the voids 108 may be used to selectively control the mechanical strength of the bond between the material layer 104 and the recoverable substrate 102.

In embodiments in which the material layer 104 comprises a semiconductor material, and the detachable interface 106 includes an intermediate material 107 comprising an electrically insulating material, the structure 100 of FIG. 1 may comprise what is referred to in the art as a "semiconductor-on-insulator" (SeOI) type substrate, such as a silicon-on-insulator (SOI) substrate or a germanium-on-insulator (GeOI) substrate. In such embodiments, the recoverable substrate 102 forms a base of the SeOI type substrate, and the intermediate material 107 forms an insulating layer between the material layer 104 and the base.

In some embodiments, the recoverable substrate 102 may be selected to comprise a material that exhibits a coefficient of thermal expansion closely matching a coefficient of thermal expansion exhibited by the material layer 104. For example, the recoverable substrate 102 may exhibit a coefficient of thermal expansion within about 10% of a coefficient of thermal expansion exhibited by the material layer 104, within about 5% of a coefficient of thermal expansion exhibited by the material layer 104, or even within about 2.5% of a coefficient of thermal expansion exhibited by the material layer 104. Closely matching the coefficients of thermal expansion of the recoverable substrate 102 and the material layer 104 may reduce or minimize thermal stresses proximate the detachable interface 106 as the temperature of the structure 100 is varied during subsequent processing, and may prevent unintentional premature separation of the material layer 104 from the recoverable substrate 102.

The recoverable substrate 102 may be thicker than the material layer 104. As non-limiting examples, the material layer 104 may have an average layer thickness T of about two hundred microns (200 μm) or less, about fifty microns (50 μm) or less, about one micron (1 μm) or less or even about one hundred nanometers (100 nm) or less. In some embodiments, the average layer thickness T may be between about fifteen nanometers (15 nm) and about one hundred microns (100 μm). The recoverable substrate 102 may have an average layer thickness of about two hundred microns (200 μm) or more, about five hundred microns (500 μm) or more, or even about seven hundred microns (700 μm) or more, in some embodiments. In embodiments in which the detachable interface 106 comprises an intermediate material 107, the intermediate material 107 may be thinner than the material layer 104, and may have an average layer thickness of, for example, about one hundred nanometers (100 nm) or less, about fifty nanometers (50 nm) or less, or even about twenty-five nanometers (25 nm) or less.

A material layer 104 having such a thin average layer thickness T may be provided over the recoverable substrate 102 using, for example, what is referred to in the art as the SMARTCUT® process. The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Briefly, the SMARTCUT® process involves implanting ions into a relatively thick material layer to form a generally planar weakened ion implant plane within the material layer. The relatively thick material layer may be bonded over the recoverable substrate 102. The relatively thick material layer then may be fractured along the weakened ion implant plane therein, leaving the material layer 104 having the desirable average layer thickness T bonded over the recoverable substrate 102. Optionally, additional semiconductor material (which may have a polycrystalline or amorphous microstructure) optionally may be deposited onto the transferred material layer 104 after the SMARTCUT® process so as to provide the material layer 104 with a desirable average layer thickness T.

In additional embodiments, a material layer 104 having such a thin average layer thickness T may be provided over the recoverable substrate 102 by first bonding a relatively thick material layer over the recoverable substrate 102 and subsequently thinning the material layer to the average layer thickness T using one or more of a grinding process, a polishing process, and an etching process (e.g., using a chemical-mechanical polishing (CMP) process). Such a bonding and thinning process may be desirable for providing a material layer 104 having an average layer thickness T of about one hundred and fifty microns (150 μm) or more, whereas the SMARTCUT® process may be desirable for providing a material layer 104 having an average layer thickness T of less than about one and a half microns (1.5 μm).

Figure 2:
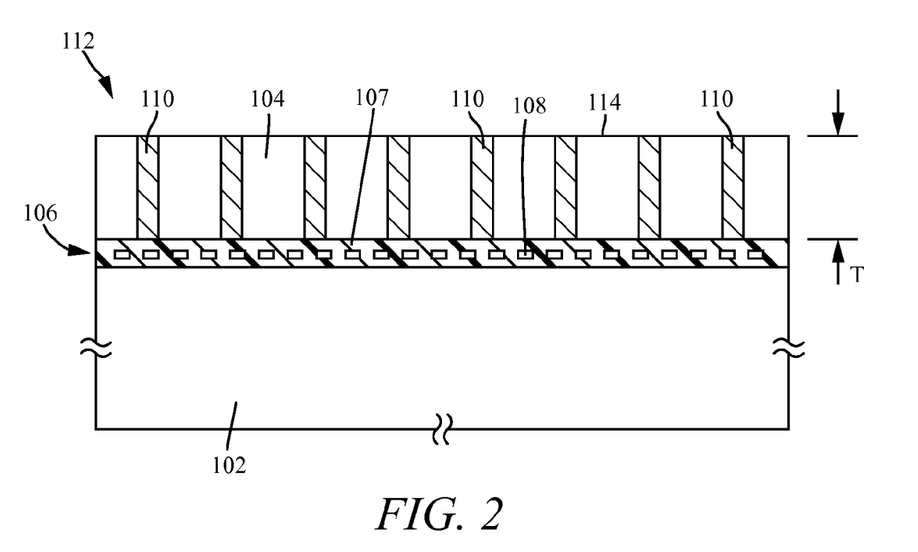
FIG. 2 is a simplified cross-sectional view illustrating conductive vias formed through the material layer of the structure shown in FIG. 1 to form at least a portion of the interposer.

Referring to FIG. 2, conductive vias 110 may be formed through the material layer 104 while the material layer 104 is on the recoverable substrate 102 to form the structure 112 of FIG. 2. The conductive vias 110 may be formed using techniques known in the art.

For example, a patterned mask may be provided over an exposed major surface 114 of the material layer 104. Apertures may extend through the patterned mask layer at locations at which the conductive vias 110 are to be formed in the material layer 104. An anisotropic etching process, such as a dry reactive ion etching (RIE) process may be used to etch holes into and through the material layer 104 through the apertures extending through the mask layer, while the mask layer shields other portions of the material layer 104 from the etchant and prevents removal of such portions.

After forming the holes through the material layer 104, a dielectric material (e.g., an oxide) may be deposited within the holes to provide isolation, after which the holes may be filled with conductive material, such as a metal, to form the conductive vias 110 within the holes. For example, the metal may comprise one or more of copper, aluminum, silver, tungsten, titanium, nickel, etc. In some embodiments, the conductive vias 110 may comprise a plurality of layers of metal, two or more of which may have differing compositions. The metal may be deposited in the holes using one or more plating processes. For example, a first electroless plating process may be used to deposit a relatively thin seed layer of metal over surfaces of the material layer 104 within the holes. Such processes may provide a relatively dense, thin layer of metal having good step coverage, thereby allowing an at least substantially continuous layer of the metal to be deposited over all surfaces within the holes. After depositing such a seed layer, another plating process, such as an electrolytic plating process, may be used to deposit additional metal over the seed layer at a relatively higher rate until the holes are at least substantially filled with metal to form the conductive vias 110. Other deposition processes, such as physical vapor deposition (PVD) processes and/or chemical vapor deposition (CVD) processes, may be used to deposit conductive material within the holes in additional embodiments.

As shown in FIG. 2, the conductive vias 110 may extend entirely through the material layer 104 from the exposed major surface 114 to the detachable interface 106. Thus, the conductive vias 110 may comprise what are referred to in the art as "through-wafer vias" (TWVs), or "through-silicon vias" (TSVs) in embodiments in which the material layer 104 comprises silicon.

The conductive vias 110 may be formed to have aspect ratios of about 2.5 or less, or even about 1.6 or less in some embodiments. By forming the conductive vias 110 to have relatively low aspect ratios, the problems associated with the formation of conductive vias having high aspect ratios previously discussed herein may be alleviated.

Further, embodiments of methods as described herein may not involve any significant thinning of the material layer 104 in which the conductive vias 110 are formed subsequent to formation of the conductive vias 110 in the material layer 104.

Figure 3:
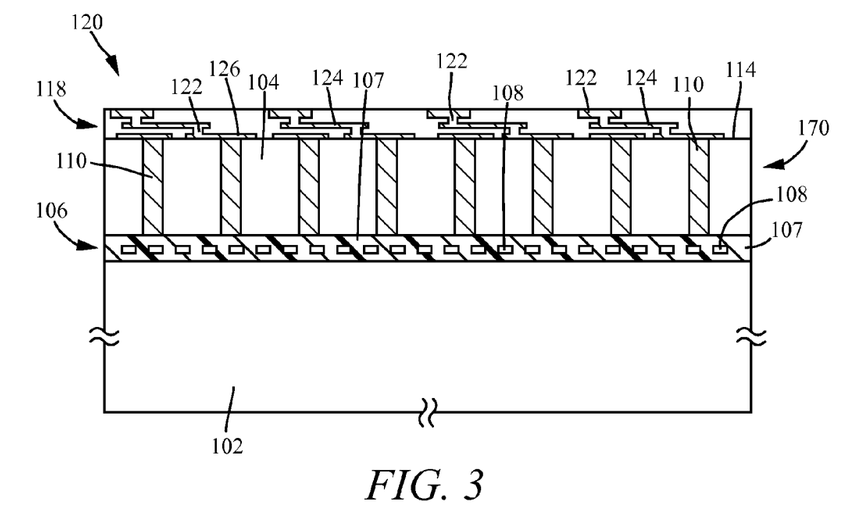
FIG. 3 is a simplified cross-sectional view illustrating a redistribution layer formed over the material layer of the interposer shown in FIG. 2 on a side of the material layer opposite the recoverable substrate.

Referring to FIG. 3, after forming of the conductive vias 110, an optional redistribution layer 118 may be formed over the material layer 104 on a side thereof opposite the recoverable substrate 102 to form the structure 120 of FIG. 3. The locations and pattern of the conductive vias 110 may not be complementary to electrical contact features of another structure or device to be coupled therewith. Thus, the redistribution layer 118 may be used to redistribute the electrical contact pattern. The redistribution layer 118 may comprise one or more of vertically extending conductive vias 122, laterally extending conductive traces 124, and conductive contact pads 126. The conductive vias 122 and traces 124 may be used to redistribute the pattern of the conductive vias 110 of the material layer 104 to a different pattern on an opposing side of the redistribution layer 118 from the material layer 104. The redistribution layer 118 may be formed in a layer-by-layer lithographic process using techniques known in the art.

Figure 4:
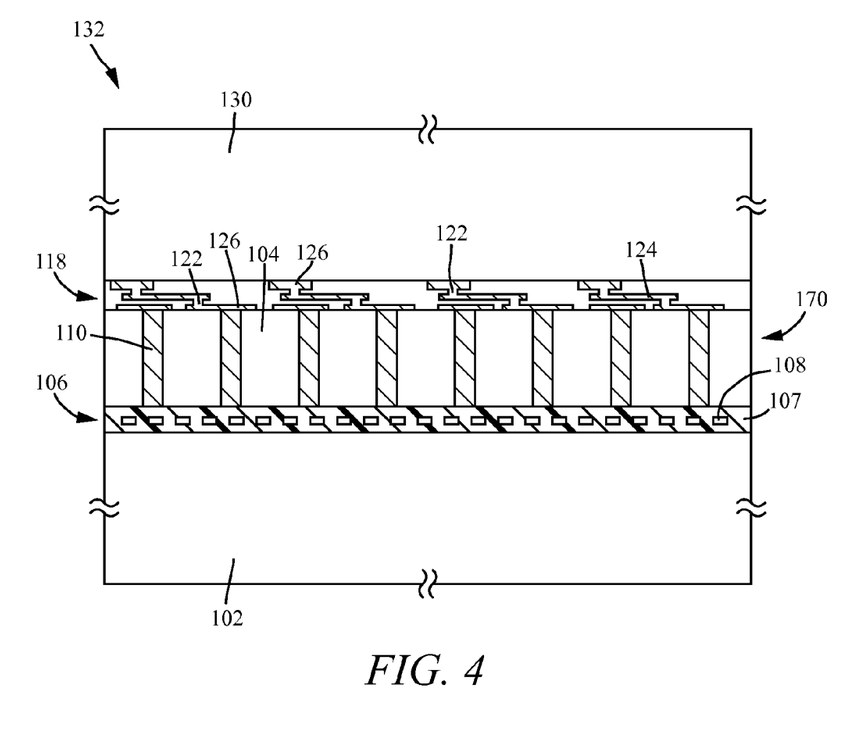
FIG. 4 is a simplified cross-sectional view illustrating a carrier substrate temporarily bonded over the material layer of the interposer shown in FIG. 3 on a side thereof opposite the recoverable substrate.

As shown in FIG. 4, a carrier substrate 130 may be temporarily bonded over the material layer 104 on a side thereof opposite the recoverable substrate 102 to form the structure 132 of FIG. 4. The carrier substrate 130 may be generally planar, and may comprise any of a number of materials. For example, the carrier substrate 130 may comprise any of the materials mentioned above in relation to the recoverable substrate 102. The carrier substrate 130 may have an average layer thickness that is sufficient to allow handling and manipulation of the structure 132 by semiconductor manufacturing equipment during subsequent processing. For example, the carrier substrate 130 may have an average layer thickness of about two hundred microns (200 μm) or more, about five hundred microns (500 μm) or more, or even about seven hundred microns (700 μm) or more. The carrier substrate 130 may be bonded over the material layer 104 using a direct molecular bonding process, or the carrier substrate 130 may be bonded over the material layer 104 using an adhesive or other bonding material between the surfaces to be bonded.

In embodiments in which a redistribution layer 118 is formed over the material layer 104 on the side thereof opposite the recoverable substrate 102, the carrier substrate 130 may be bonded to the redistribution layer 118 over the material layer 104. In embodiments in which such a redistribution layer 118 is not formed, the carrier substrate 130 may be bonded to the material layer 118.

Figure 5:
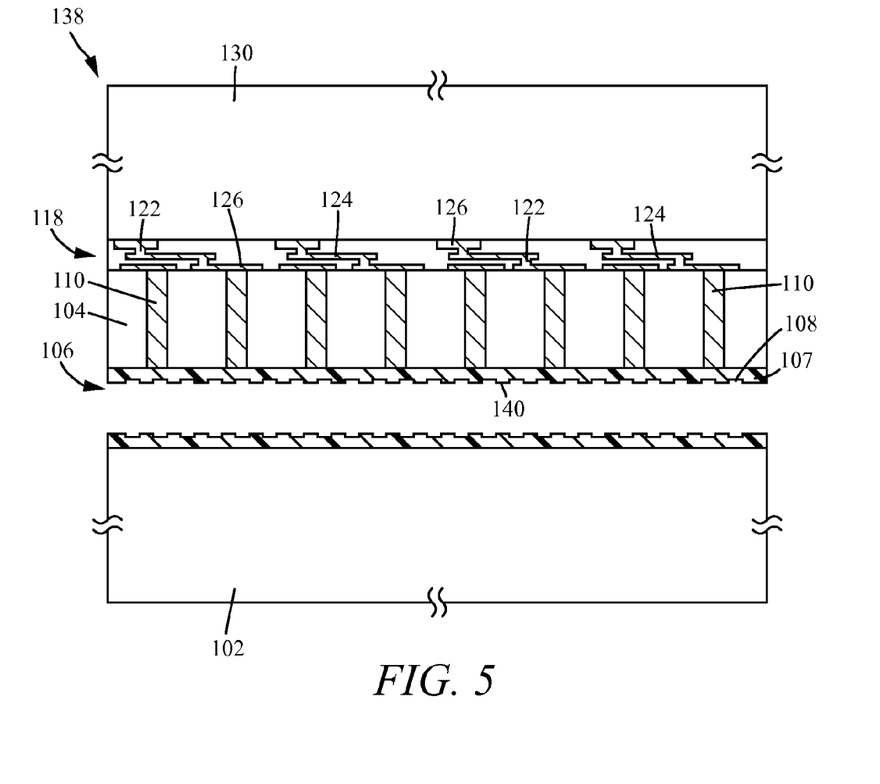
FIG. 5 is a simplified cross-sectional view illustrating separation of the material layer of the interposer from the recoverable substrate shown in FIG. 4 along the detachable interface between the interposer and the recoverable substrate.

Referring to FIG. 5, the recoverable substrate 102 may be separated from the material layer 104 after bonding the carrier substrate 130 over the material layer 104 (as described with reference to FIG. 4) to recover the recoverable substrate 102, and form the structure 138 shown in FIG. 5. In particular, the recoverable substrate 102 may be separated from the material layer 104 along the detachable interface 106. The recoverable substrate 102 then may be reused, if desirable. In other words, the recoverable substrate 102 may be recyclable. Recycling of the recoverable substrate 102 may reduce waste and fabrication costs.

The recoverable substrate 102 may be separated from the material layer 104 using, for example, equipment and methods described in the aforementioned U.S. Patent Application Publication No. 2007/0122926, published May 31, 2007 in the name of Martinez et al. As described therein, a fixed positioning member may be employed to secure the structure 132 of FIG. 4, and a cutting mechanism including a blade may be used to contact the structure 132 in such a manner as to induce a cleaving wave that propagates across the detachable interface 106. In some embodiments, a notch may be formed in the lateral side surface of the structure 132 of FIG. 4, and the blade of the cutting mechanism may be inserted into the notch with force to induce the cleaving wave along the detachable interface 106 between the recoverable substrate 102 and the material layer 104.

As shown in FIG. 5, after separating the recoverable substrate 102 from the material layer 104, a fracture surface 140 of the structure 138 may be relatively rough, and, in some embodiments, may include residual intermediate material 107. Thus, the fracture surface 140 may be cleaned and/or smoothed as desirable. For example, one or more of an etching process, a grinding process, and a polishing process (e.g., a chemical-mechanical polishing (CMP) process) may be used to smoothen the fracture surface 140. After smoothing the fracture surface 140, a standard cleaning process may be used to remove any remaining unwanted material thereon.

Figure 6:
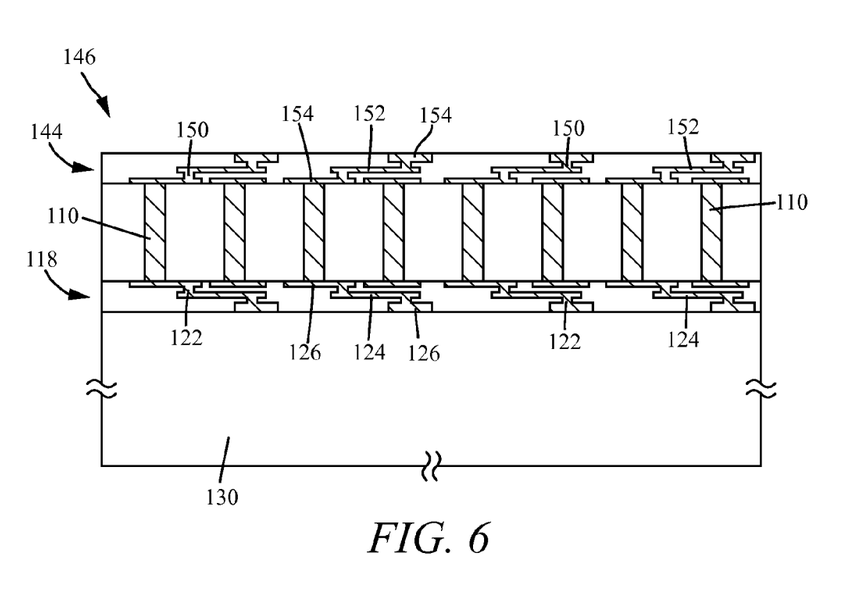
FIG. 6 is a simplified cross-sectional view illustrating another redistribution layer formed over the material layer of the interposer shown in FIG. 5 on a side of the material layer opposite the carrier substrate.

As shown in FIG. 6, an optional redistribution layer 144 may be formed over the material layer 104 on a side thereof opposite the carrier substrate 130 to form the structure 146 of FIG. 6. As previously described, the locations and pattern of the conductive vias 110 may not be complementary to electrical contact features of another structure or device to be coupled therewith. Thus, the redistribution layer 144, like the redistribution layer 118, may be used to redistribute the electrical contact pattern. The redistribution layer 144 may comprise one or more of vertically extending conductive vias 150, laterally extending conductive traces 152, and conductive contact pads 154. The conductive vias 150 and traces 152 may be used to redistribute the pattern of the conductive vias 110 of the material layer 104 to a different pattern on an opposing side of the redistribution layer 144 from the material layer 104. The redistribution layer 144 may be formed in a layer-by-layer lithographic process using techniques known in the art.

Figure 7:
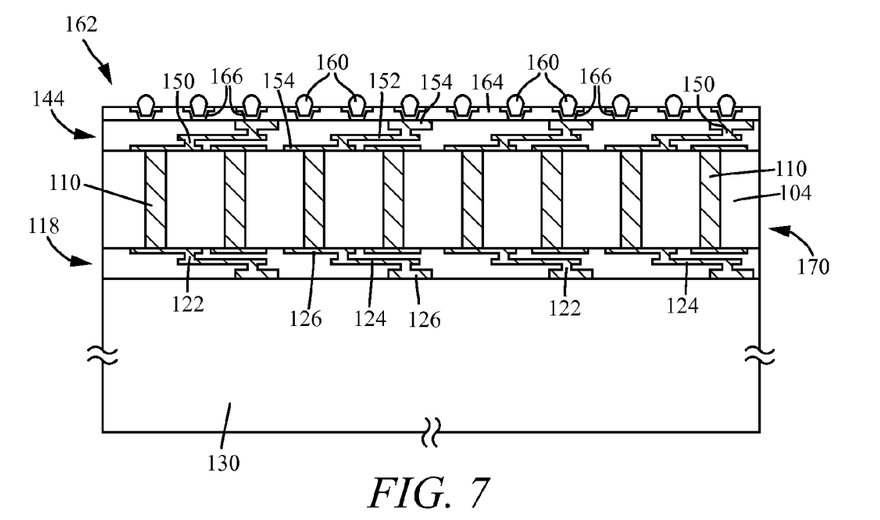
FIG. 7 is a simplified cross-sectional view illustrating electrical contacts formed over the material layer of the interposer shown in FIG. 6 on a side thereof opposite the carrier substrate.

Referring to FIG. 7, electrical contacts 160 may be formed over the material layer 104 on a side thereof opposite the carrier substrate 130 to form the structure 162 of FIG. 7. The electrical contacts 160 communicate electrically with the conductive vias 110. In embodiments in which the structure 162 includes the optional redistribution layer 144, the electrical contacts 160 communicate electrically with the conductive vias 110 through the conductive vias 150, traces 152, and pads 154 of the redistribution layer 144. In embodiments that do not include the optional redistribution layer 144, the electrical contacts 160 may be formed directly on the conductive vias 110 so as to establish direct electrical communication with the conductive vias 110.

Various types of electrical contacts 160 are known in the art and may be employed in embodiments of the present disclosure. As a non-limiting example, the electrical contacts 160 may comprise conductive bumps formed over the material layer 104. As known in the art, a dielectric material 164 may be provided over the material layer 104, and an aperture may be formed through the dielectric material 164 at locations at which it is desired to form the conductive bumps. So called "under-bump metallurgy" processes then may be used to deposit one or more layers of conductive metal 166 within the apertures. The conductive bumps then may be formed on the conductive metal 166 deposited within the apertures extending through the dielectric material 164.

Thus, as described above, an interposer 170 is formed that includes the material layer 104 having the conductive vias 110 (e.g., through-wafer vias (TWVs)) extending through the material layer 104. The interposer 170 also may include an optional redistribution layer 118 on a first side of the material layer 104, and/or an optional redistribution layer 144 on an opposing second side of the material layer 104. In the state of FIG. 7, in which the interposer 170 remains temporarily bonded to the carrier substrate 130, the interposer 170 may include electrical contacts 160 over the material layer 104 on a side thereof opposite the carrier substrate 130. Additional electrical contacts may be subsequently formed on the interposer 170 over the opposing side of the material layer 104 after detaching the carrier substrate 130 from the interposer 170, as discussed further below.

Figure 8:
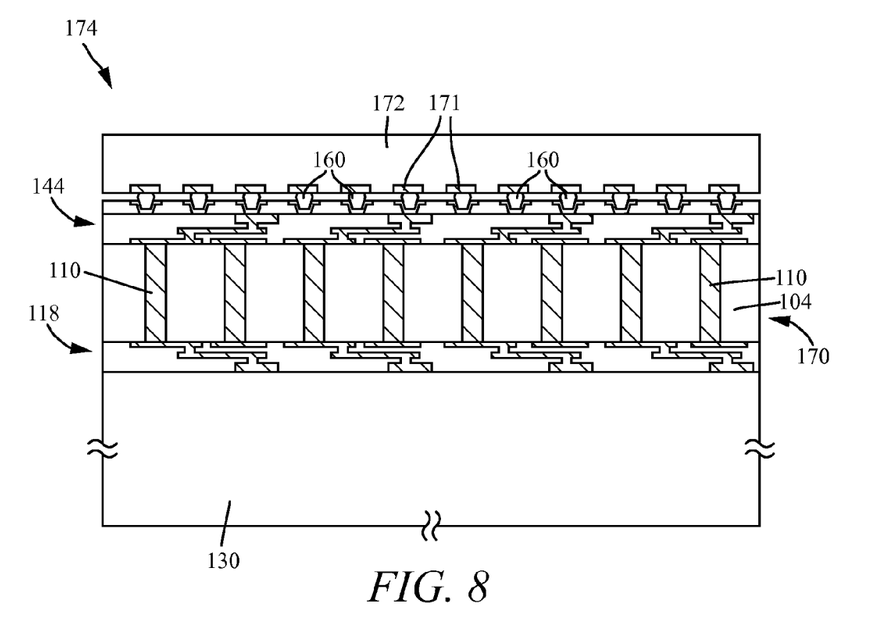
FIG. 8 is a simplified cross-sectional view illustrating an integrated circuit device structurally and electrically coupled to the structure shown in FIG. 7 on a side of the interposer opposite the carrier substrate.

Referring to FIG. 8, prior to removing the carrier substrate 130 from the material layer 104, conductive features 171 of a first structure or device, such as an integrated circuit device 172, may be structurally and electrically coupled to the electrical contacts 160 of the interposer 170 to form the structure 174 of FIG. 8. The integrated circuit device 172 may be selected to comprise one or more of an electronic signal processor, a memory device, and a photoactive device (e.g., a light-emitting device (LED), a laser diode, a photocell, a photodetector, etc.).

Figure 9:
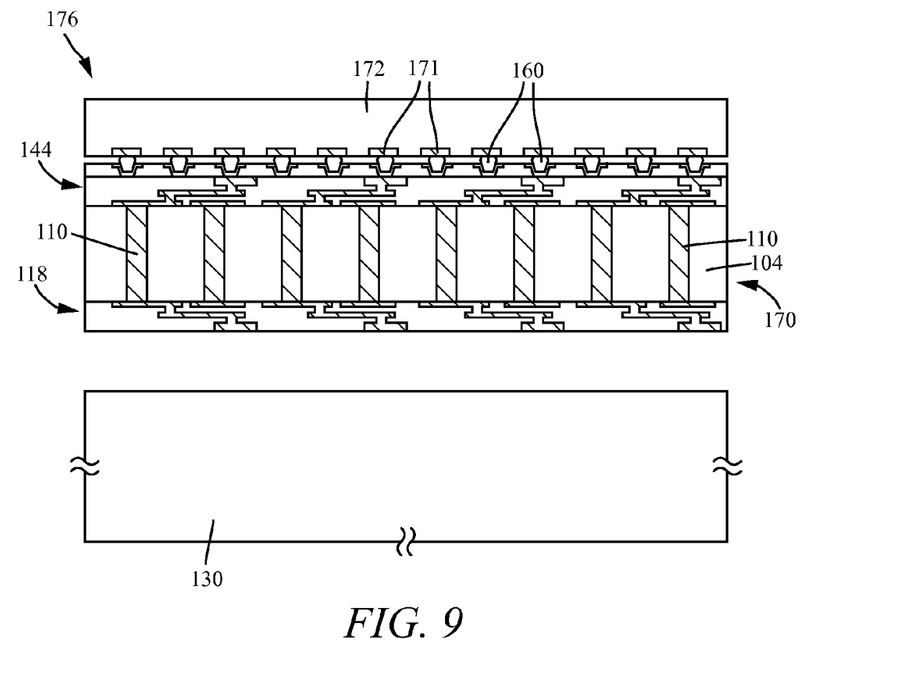
FIG. 9 illustrates removal of the carrier substrate from the structure of FIG. 8.
Figure 10:
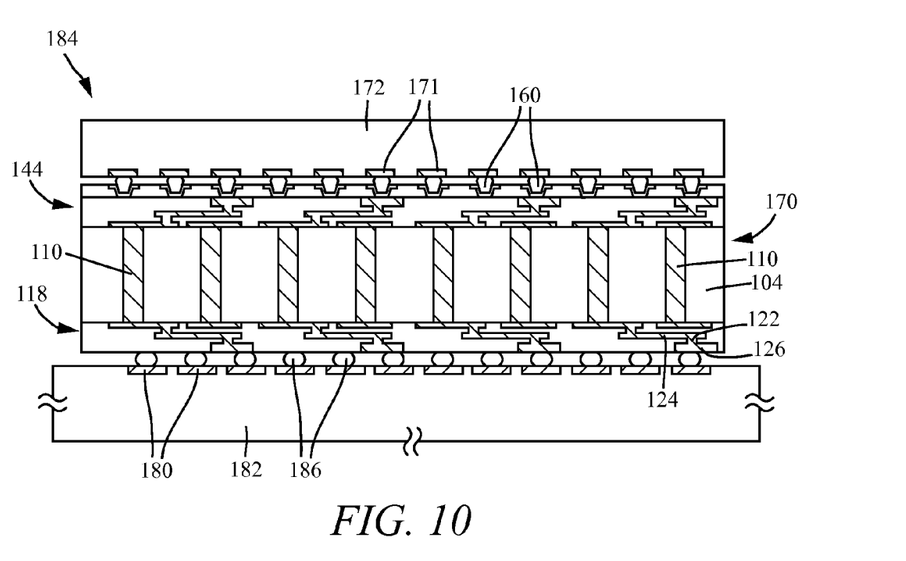
FIG. 10 illustrates another structure or device structurally and electrically coupled to the interposer on a side thereof opposite the integrated circuit device.

As shown in FIG. 9, the carrier substrate 130 then may be separated from the material layer 104 to form the structure 176, which includes the interposer 170 and the integrated circuit device 172. After removing the carrier substrate 130, the structure 176 of FIG. 9 may be structurally and electrically coupled to conductive features 180 of another structure or device 182 to form the structure 184 of FIG. 10. The another structure or device 182 may comprise, for example, another integrated circuit device such as any of those previously mentioned herein, a printed circuit board, etc. Thus, electrical contact is established between the conductive vias 110 of the material layer 104 of the interposer 170 and the conductive features 180 of the structure or device 182. Further, electrical contact is established between the integrated circuit device 172 and the structure or device 182 through the conductive vias 110 of the material layer 104 of the interposer 170, which is interposed between the integrated circuit device 172 and the structure or device 182.

Various techniques known in the art may be used to structurally and electrically couple the structure 176 of FIG. 9 to the conductive features 180 of the structure or device 182. As a non-limiting example, conductive bumps 186 may be formed on the conductive features 180, or on complementary conductive features of the interposer 170, such as exposed ends of the conductive vias 110 (if the interposer does not include the optional redistribution layer 144), or conductive pads 154 of the optional redistribution layer 144. As a non-limiting example, conductive bumps 186 may be formed over the material layer 104 using techniques like those described above in relation to the electrical contacts 160. In additional embodiments, conductive bumps may be formed on the conductive features 180 of the structure or device 182.

Using techniques described herein, numerous interposers 170 may be fabricated with conductive vias 110 fabricated in a common, generic pattern, although the interposers 170 may be intended for use with a number of different structures and devices having varying contact feature patterns. The redistribution layers 118, 144 may be configured and fabricated differently for the different subsets of the interposers 170 so as to customize the different subsets for use with the different structures and devices.

Additional non-limiting embodiments of the present disclosure are set forth below:

Embodiment 1: A method of fabricating a semiconductor device including an interposer, comprising: forming conductive vias through a material layer on a recoverable substrate; bonding a carrier substrate over the material layer on a side thereof opposite the recoverable substrate; separating the recoverable substrate from the material layer to recover the recoverable substrate; and forming electrical contacts over the material layer on a side thereof opposite the carrier substrate, the electrical contacts communicating electrically with the conductive vias.

Embodiment 2: The method of Embodiment 1, further comprising selecting the material layer to have an average layer thickness of about one hundred microns (100 μm) or less.

Embodiment 3: The method of Embodiment 2, further comprising selecting the material layer to have an average layer thickness of between about fifteen nanometers (15 nm) and about one hundred microns (100 µm).

Embodiment 4: The method of any one of Embodiments 1 through 3, further comprising selecting the material layer to comprise a semiconductor material.

Embodiment 5: The method of Embodiment 4, further comprising selecting the material layer to comprise at least one of silicon, germanium, and a III-V semiconductor material.

Embodiment 6: The method of Embodiment 5, further comprising selecting the material layer to comprise silicon.

Embodiment 7: The method of any one of Embodiments 1 through 6, wherein forming conductive vias through the material layer on the recoverable substrate comprises forming the conductive vias through a layer of semiconductor material of a semiconductor-on-insulator (SeOI) structure, the SeOI structure including a base comprising the recoverable substrate and an insulating layer between the base and the layer of semiconductor material.

Embodiment 8: The method of Embodiment 7, wherein the base comprises a material exhibiting a coefficient of thermal expansion closely matching a coefficient of thermal expansion exhibited by the layer of semiconductor material.

Embodiment 9: The method of Embodiment 7 or Embodiment 8, wherein separating the recoverable substrate from the material to recover the recoverable substrate comprises separating the layer of semiconductor material from the base along the insulating layer.

Embodiment 10: The method of any one of Embodiments 1 through 9, further comprising forming the conductive vias to have aspect ratios of about 2.5 or less.

Embodiment 11: The method of Embodiment 10, further comprising forming the conductive vias to have aspect ratios of about 1.6 or less.

Embodiment 12: The method of any one of Embodiments 1 through 11, further comprising forming a detachable interface between the recoverable substrate and the material layer prior to separating the recoverable substrate from the material layer to recover the recoverable substrate, the detachable interface comprising a bond of controlled mechanical strength between the material layer and the recoverable substrate.

Embodiment 13: The method of any one of Embodiments 1 through 12, further comprising forming a redistribution layer over the material layer on the side thereof opposite the recoverable substrate prior to bonding the carrier substrate over the material layer on the side thereof opposite the recoverable substrate.

Embodiment 14: The method of Embodiment 13, further comprising forming another redistribution layer over the material layer on the side thereof opposite the carrier substrate prior to forming electrical contacts over the material layer on the side thereof opposite the carrier substrate, the electrical contacts communicating electrically with the conductive vias through the another redistribution layer.

Embodiment 15: The method of any one of Embodiments 1 through 12, further comprising forming another redistribution layer over the material layer on the side thereof opposite the carrier substrate prior to forming electrical contacts over the material layer on the side thereof opposite the carrier substrate, the electrical contacts communicating electrically with the conductive vias through the another redistribution layer.

Embodiment 16: The method of any one of Embodiments 1 through 15, wherein forming electrical contacts over the material layer on the side thereof opposite the carrier substrate comprises forming conductive bumps over the material layer.

Embodiment 17: The method of any one of Embodiments 1 through 16, further comprising structurally and electrically coupling conductive features of an integrated circuit device to the electrical contacts.

Embodiment 18: The method of Embodiment 17, further comprising selecting the integrated circuit device to comprise at least one of an electronic signal processor, a memory device, and a photoactive device.

Embodiment 19: The method of Embodiment 17 or Embodiment 18, further comprising establishing electrical contact between the conductive vias and conductive features of a structure or device on a side of the material layer opposite the integrated circuit device, the material layer and conductive vias being interposed between the integrated circuit device and the another structure or device.

Embodiment 20: The method of any one of Embodiments 1 through 19, further comprising separating the carrier substrate from the material layer.

Embodiment 21: An intermediate structure formed during fabrication of a semiconductor device, the intermediate structure comprising: a semiconductor layer bonded over a recoverable substrate with a detachable interface of controlled mechanical strength between the semiconductor layer and the recoverable substrate; conductive vias extending through the semiconductor layer; and a carrier substrate bonded over the semiconductor layer on a side thereof opposite the recoverable substrate.

Embodiment 22: The intermediate structure of Embodiment 21, wherein the semiconductor layer has an average layer thickness of between about one fifteen nanometers (15 nm) and about one hundred microns (100 µm).

Embodiment 23: The intermediate structure of Embodiment 21 or Embodiment 22, wherein the semiconductor layer comprises silicon.

Embodiment 24: The intermediate structure of any one of Embodiments 21 through 23, wherein the conductive vias have aspect ratios of about 2.5 or less.

Embodiment 25: The intermediate structure of any one of Embodiments 21 through 24, further comprising a redistribution layer over the semiconductor layer between the carrier substrate and the semiconductor layer.

Embodiment 26: A method of fabricating a semiconductor device including an interposer, comprising: forming a detachable interface between a semiconductor layer and a recoverable substrate, the detachable interface comprising a controlled level of mechanical strength between the semiconductor layer and the recoverable substrate; forming conductive vias through the semiconductor layer on the recoverable substrate; bonding a carrier substrate over the semiconductor layer on a side thereof opposite the recoverable substrate; separating the recoverable substrate from the semiconductor layer to recover the recoverable substrate; and forming electrical contacts over the semiconductor layer on a side thereof opposite the carrier substrate, the electrical contacts communicating electrically with the conductive vias.

Embodiment 27: The method of Embodiment 26, further comprising selecting the semiconductor layer to have an average layer thickness of between about one fifteen nanometers (15 nm) and about one hundred microns (100 µm).

Embodiment 28: The method of Embodiment 26 or Embodiment 27, further comprising selecting the semiconductor layer to comprise silicon.

Embodiment 29: The method of any one of Embodiments 26 through 28, further comprising forming the conductive vias to have aspect ratios of about 2.5 or less.

Embodiment 30: The method of Embodiment 29, further comprising forming the conductive vias to have aspect ratios of about 1.6 or less.

Embodiment 31: The method of any one of Embodiments 26 through 30, further comprising forming a redistribution layer over the semiconductor layer on the side thereof opposite the recoverable substrate prior to bonding the carrier substrate over the semiconductor layer on the side thereof opposite the recoverable substrate.

Embodiment 32: The method of any one of Embodiments 26 through 31, further comprising forming a redistribution layer over the semiconductor layer on the side thereof opposite the carrier substrate prior to forming electrical contacts over the semiconductor layer on the side thereof opposite the carrier substrate, the electrical contacts communicating electrically with the conductive vias through the redistribution layer.

Embodiment 33: The method of any one of Embodiments 26 through 32, further comprising: structurally and electrically coupling conductive features of an integrated circuit device to the electrical contacts; and separating the carrier substrate from the semiconductor layer.

Embodiment 34: The method of Embodiment 33, further comprising selecting the integrated circuit device to comprise at least one of an electronic signal processor, a memory device, and a photoactive device.

Embodiment 35: The method of Embodiment 33 or Embodiment 34, further comprising establishing electrical contact between the conductive vias and conductive features of another structure or device on a side of the semiconductor layer opposite the integrated circuit device, the semiconductor layer and conductive vias being interposed between the integrated circuit device and the another structure or device.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the embodiments, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of fabricating a semiconductor device including an interposer, comprising:
   forming a semiconductor-on-insulator (SeOI) structure comprising a base recoverable substrate, a layer of semiconductor material, and an insulating layer between the base recoverable substrate and the layer of semiconductor material;
   forming conductive vias extending through the layer of semiconductor material but not the insulating layer of the SeOI structure and forming at least a portion of the interposer to comprise the conductive vias and the layer of semiconductor material;
   forming the conductive vias to have aspect ratios of about 2.5 or less;
   bonding a carrier substrate over the layer of semiconductor material on a side thereof opposite the recoverable substrate;
   separating the recoverable substrate from the layer of semiconductor material to recover the recoverable substrate; and
   forming electrical contacts over the layer of semiconductor material on a side thereof opposite the carrier substrate, the electrical contacts communicating electrically with the conductive vias.

2. The method of claim 1, further comprising selecting the layer of semiconductor material to have an average layer thickness of about one hundred microns (100 µm) or less.

3. The method of claim 2, further comprising selecting the layer of semiconductor material to have an average layer thickness of between about fifteen nanometers (15 nm) and about one hundred microns (100 µm).

4. The method of claim 1, further comprising selecting the layer of semiconductor material to comprise at least one of silicon, germanium, and a III-V semiconductor material.

5. The method of claim 4, further comprising selecting the layer of semiconductor material to comprise silicon.

6. The method of claim 1, wherein the base recoverable substrate comprises a material exhibiting a coefficient of thermal expansion closely matching a coefficient of thermal expansion exhibited by the layer of semiconductor material.

7. The method of claim 1, wherein separating the recoverable substrate from the layer of semiconductor material to recover the recoverable substrate comprises separating the layer of semiconductor material from the base recoverable substrate along the insulating layer.

8. The method of claim 1, further comprising forming the conductive vias to have aspect ratios of about 1.6 or less.

9. The method of claim 1, further comprising forming a detachable interface between the recoverable substrate and the layer of semiconductor material prior to separating the recoverable substrate from the layer of semiconductor material to recover the recoverable substrate, the detachable interface comprising a bond of controlled mechanical strength between the layer of semiconductor material and the recoverable substrate.

10. The method of claim 1, further comprising forming a redistribution layer over the layer of semiconductor material on the side thereof opposite the recoverable substrate prior to bonding the carrier substrate over the layer of semiconductor material on the side thereof opposite the recoverable substrate.

11. The method of claim 10, further comprising forming another redistribution layer over the layer of semiconductor material on the side thereof opposite the carrier substrate prior to forming electrical contacts over the layer of semiconductor material on the side thereof opposite the carrier substrate, the electrical contacts communicating electrically with the conductive vias through the another redistribution layer.

12. The method of claim 1, further comprising forming a redistribution layer over the layer of semiconductor material on the side thereof opposite the carrier substrate prior to forming electrical contacts over the layer of semiconductor material on the side thereof opposite the carrier substrate, the electrical contacts communicating electrically with the conductive vias through the redistribution layer.

13. The method of claim 1, wherein forming electrical contacts over the layer of semiconductor material on the side thereof opposite the carrier substrate comprises forming conductive bumps over the layer of semiconductor material.

14. The method of claim 1, further comprising structurally and electrically coupling conductive features of an integrated circuit device to the electrical contacts.

15. The method of claim 14, further comprising selecting the integrated circuit device to comprise at least one of an electronic signal processor, a memory device, and a photoactive device.

16. The method of claim 15, further comprising separating the carrier substrate from the layer of semiconductor material.

17. The method of claim 16, further comprising establishing electrical contact between the conductive vias and conductive features of another structure or device on a side of the layer of semiconductor material opposite the integrated circuit device, the layer of semiconductor material and conductive vias being interposed between the integrated circuit device and the another structure or device.

18. A method of fabricating a semiconductor device including an interposer, comprising:
forming a semiconductor-on-insulator (SeOI) structure comprising a base recoverable substrate, a semiconductor layer, and an insulating layer as a detachable interface between the semiconductor layer and the base recoverable substrate, the detachable interface comprising a controlled level of mechanical strength between the semiconductor layer and the base recoverable substrate;
forming conductive vias extending through the semiconductor layer but not the insulating layer of the SeOI structure and forming at least a portion of the interposer comprising the conductive vias and the semiconductor layer;
bonding a carrier substrate over the semiconductor layer on a side thereof opposite the recoverable substrate;
separating the recoverable substrate from the semiconductor layer to recover the recoverable substrate; and
forming electrical contacts over the semiconductor layer on a side thereof opposite the carrier substrate, the electrical contacts communicating electrically with the conductive vias.

19. The method of claim 18, further comprising selecting the semiconductor layer to have an average layer thickness of between about fifteen nanometers (15 nm) and about one hundred microns (100 μm).

20. The method of claim 18, further comprising selecting the semiconductor layer to comprise silicon.

21. The method of claim 18, further comprising forming the conductive vias to have aspect ratios of about 2.5 or less.

22. The method of claim 21, further comprising forming the conductive vias to have aspect ratios of about 1.6 or less.

23. The method of claim 18, further comprising forming a redistribution layer over the semiconductor layer on the side thereof opposite the recoverable substrate prior to bonding the carrier substrate over the semiconductor layer on the side thereof opposite the recoverable substrate.

24. The method of claim 23, further comprising forming another redistribution layer over the semiconductor layer on the side thereof opposite the carrier substrate prior to forming electrical contacts over the semiconductor layer on the side thereof opposite the carrier substrate, the electrical contacts communicating electrically with the conductive vias through the another redistribution layer.

25. The method of claim 18, further comprising:
structurally and electrically coupling conductive features of an integrated circuit device to the electrical contacts; and
separating the carrier substrate from the semiconductor layer.

26. The method of claim 25, further comprising selecting the integrated circuit device to comprise at least one of an electronic signal processor, a memory device, and a photoactive device.

27. The method of claim 26, further comprising establishing electrical contact between the conductive vias and conductive features of another structure or device on a side of the semiconductor layer opposite the integrated circuit device, the semiconductor layer and conductive vias being interposed between the integrated circuit device and the another structure or device.

* * * * *

UNITED STATES PATENT AND TRADEMARK OFFICE
CERTIFICATE OF CORRECTION

PATENT NO. : 8,970,045 B2  Page 1 of 1
APPLICATION NO. : 13/397954
DATED : March 3, 2015
INVENTOR(S) : Mariam Sadaka It is certified that error appears in the above-identified patent and that said Letters Patent is hereby corrected as shown below:

On the title page:
In ITEM (56) References Cited
U.S. PATENT DOCUMENTS
Page 1, 2nd column, line 1, change "RE39,484 E" to --RE39,484 E1--

In the specification:
COLUMN 3, LINE 8, change "interface comprising" to --interface comprises--
COLUMN 8, LINE 36, change "layer 118." to --layer 104.--
COLUMN 10, LINE 34, change "layer 144)," to --layer 118),--
COLUMN 10, LINE 35, change "pads 154" to --pads 126--
COLUMN 10, LINE 35, change "layer 144." to --layer 118.--

Signed and Sealed this
Twenty-ninth Day of September, 2015

Michelle K. Lee
*Director of the United States Patent and Trademark Office*